United States Patent
Gudeman et al.

(10) Patent No.: US 10,804,850 B2
(45) Date of Patent: Oct. 13, 2020

(54) GAS SENSOR USING MM WAVE CAVITY

(71) Applicant: Innovative Micro Technology, Goleta, CA (US)

(72) Inventors: Christopher S. Gudeman, Lompoc, CA (US); Abbaspour Tamijani, San Diego, CA (US)

(73) Assignee: Innovative Micro Technology, Goleta, CA (US)

(*) Notice: Subject to any disclaimer, the term of this patent is extended or adjusted under 35 U.S.C. 154(b) by 250 days.

(21) Appl. No.: 16/104,146

(22) Filed: Aug. 17, 2018

(65) Prior Publication Data
US 2019/0068120 A1  Feb. 28, 2019

Related U.S. Application Data

(60) Provisional application No. 62/550,569, filed on Aug. 26, 2017.

(51) Int. Cl.
| | | |
|---|---|---|
| *H03B 9/14* | (2006.01) | |
| *H01L 47/02* | (2006.01) | |
| *H03B 7/14* | (2006.01) | |
| *G01H 13/00* | (2006.01) | |
| *H03B 5/18* | (2006.01) | |
| *H03B 7/06* | (2006.01) | |
| *G01N 22/00* | (2006.01) | |
| *H03B 9/12* | (2006.01) | |

(52) U.S. Cl.
CPC .............. *H03B 9/145* (2013.01); *G01H 13/00* (2013.01); *G01N 22/00* (2013.01); *H01L 47/026* (2013.01); *H03B 5/1823* (2013.01); *H03B 7/06* (2013.01); *H03B 7/14* (2013.01); *H03B 2009/123* (2013.01); *H03B 2009/126* (2013.01); *H03B 2200/0032* (2013.01)

(58) Field of Classification Search
CPC ........ H03B 9/145; H03B 7/14; H03B 5/1823; H03B 7/06; H03B 2200/0032; H03B 2009/126; H03B 2009/123; G01N 22/00; H01L 47/026; G01H 13/00
USPC ........................................................ 73/24.02
See application file for complete search history.

(56) References Cited

U.S. PATENT DOCUMENTS

| | | | | |
|---|---|---|---|---|
| 5,365,243 A | * | 11/1994 | Buchler | ............... H01Q 1/3275 333/247 |
| 7,068,121 B2 | * | 6/2006 | Ding | .......................... H01P 5/08 333/21 R |
| 7,526,970 B2 | * | 5/2009 | Mawer | ................. G01N 27/622 73/31.05 |

(Continued)

OTHER PUBLICATIONS

Memon et al., "Millimeter-Wave Chemical Sensor Using Substrate-Integrated-Waveguide Cavity", Sensors 2016, 16, 1829 (Year: 2016).*

(Continued)

*Primary Examiner* — Nathaniel T Woodward
(74) *Attorney, Agent, or Firm* — Jaquelin K. Spong

(57) ABSTRACT

Systems and methods for forming a compact gas sensor include using a lithographically fabricated high Q resonator coupled to at least one of a Gunn diode and an IMPATT diode. The resonator may include a plurality of cavities filled with a sample gas. A detector coupled to the resonator may measure the amplitude of the emitted mm wave radiation.

19 Claims, 8 Drawing Sheets

(56) References Cited

U.S. PATENT DOCUMENTS

| | | | |
|---|---|---|---|
| 9,032,782 B1* | 5/2015 | Van Deusen | G01N 33/50 |
| | | | 73/61.45 |
| 9,958,330 B2* | 5/2018 | Koyama | G01J 5/0825 |
| 2009/0140751 A1* | 6/2009 | Takeuchi | G01B 7/06 |
| | | | 324/635 |
| 2010/0321191 A1* | 12/2010 | Gong | G01N 22/02 |
| | | | 340/584 |
| 2011/0063054 A1* | 3/2011 | Mendis | H01P 7/06 |
| | | | 333/230 |
| 2011/0152725 A1* | 6/2011 | Demir | A61B 5/103 |
| | | | 600/587 |
| 2011/0253897 A1* | 10/2011 | Saeedkia | G01N 21/3581 |
| | | | 250/358.1 |
| 2014/0292305 A1* | 10/2014 | Fuse | G01R 23/165 |
| | | | 324/76.23 |
| 2015/0028889 A1* | 1/2015 | Gong | G01K 7/24 |
| | | | 324/633 |
| 2016/0258807 A1* | 9/2016 | Pein | G01J 5/046 |

OTHER PUBLICATIONS

Hallil et al., "Novel millimeter-wave gas sensor using dielectric resonator with sensitive layer on TiO2", IEEE Sensors 2009 Conference (Year: 2009).*

* cited by examiner

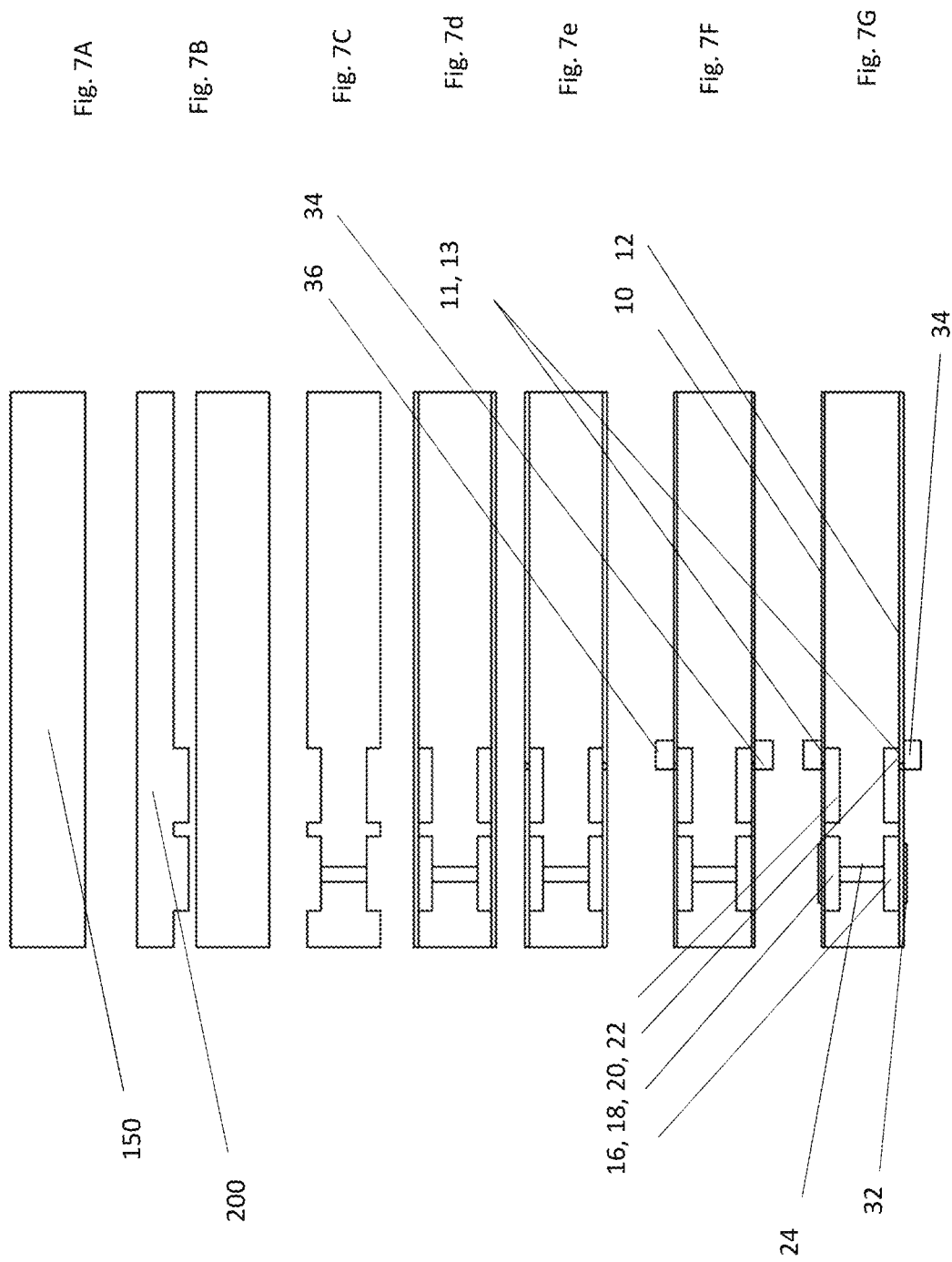

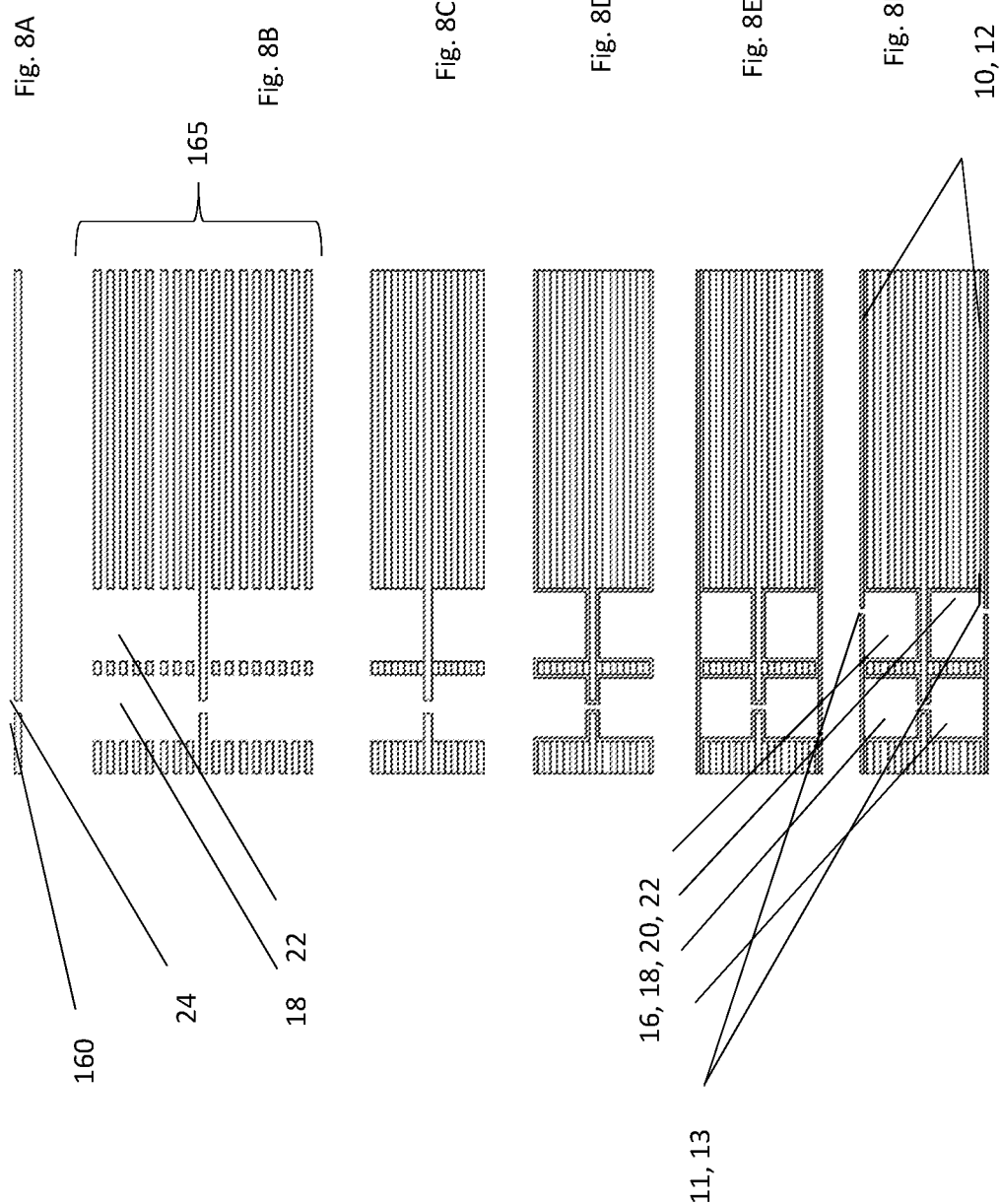

GAS SENSOR USING MM WAVE CAVITY

CROSS REFERENCE TO RELATED APPLICATIONS

This nonprovisional U.S. Patent Application claims priority to U.S. Provisional Application Ser. No. 62/550,569, filed Aug. 25, 2017 and incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to a gas sensing device.

Gas sensors require high sensitivity and high specificity, two factors that are often in opposition, since a very sensitive system will likely be sensitive to many gases. But high sensitivity is extremely important, because small quantities of some compounds in the air can be toxic or fatal. For example, exposure to 1 part per million of CO in the atmosphere will cause headaches in 10 minutes and irreversible brain damage 60 minutes. Chemical receptor systems that provide very high sensitivity to CO, often have a low level sensitivity to $CO_2$, which is far more abundant. Thus, distinguishing between harmful and benign gases is a problem. Chemical receptor systems can become contaminated, which causes a loss in sensitivity and consequent risk to personnel.

Prior art gas sensors fall into several categories.
1) Chemical receptor for specific capture of the target molecule
2) Resonant beam structures to determine the mass of the molecule
3) Sensors that combust the target species and measure its exothermicity
4) Chemical Field Effect Transistors (Chem-FET)
5) Combinations of the above.

All of these to some extent share the following drawbacks
1) Contamination
2) Probable false readings (inaccuracy)
3) Low sensitivity
4) Low specificity Accordingly, a new technology is needed for sensing these dangerous compounds in homes, offices and industrial settings. Ideally this technology is small, inexpensive, robust and highly sensitive.

SUMMARY

The technology described here uses a photolithographically fabricated cavity resonator that can be manufactured inexpensively with extremely tight tolerances. A plurality of such cavities may be assembled into a gas sensing device, wherein the gas is admitted into the cavities. The high Q nature of the cavities has the effect of providing a very long absorption path length within the gas sample, while keeping the overall dimensions compact. This results in a cost-effective, robust and highly sensitive gas sensing device which can be deployed in challenging, hostile environments and in tight spaces.

The device described here uses a solid state Gunn diode or an IMPATT diode as mm wave source, which is coupled into a high-Q cavity resonator. These sources are precisely tunable, by varying the voltage applied to the devices. The tunable range of the mm wave source may overlap an absorption feature of the gas sample, and the width of an emission spectrum may ideally be narrower thanks similar to the absorption feature.

A cavity resonator may function as a high-Q bandpass filter. When the cavity resonance matches the diode frequency, the cavity will pass the diode energy with low loss. When the cavity and diode are mis-matched, the diode energy will be blocked. Designs often achieve 80 dB rejection. If the sample gas is admitted into this cavity, the Q and the rejection ratio will be degraded in proportion to the concentration and the intrinsic absorption strength of the sample gas.

Described below is a gas sensing device, which includes a mm wave source, emitting radiation having a frequency spectrum in the mm range and at least one lithographically fabricated high-Q resonator, and coupled to the mm wave source, wherein the resonator has at least one cavity formed in a semiconductor substrate, with a characteristic dimension of about one half of a wavelength in the frequency spectrum of the mm-wave emission source, wherein the at least one cavity is dimensioned to define a resonant structure for at least some frequencies in the frequency spectrum of the mm wave source. The frequency spectrum may be, for example, between about 10 to about 500 GHz. Accordingly, the cavities have a characteristic dimension of between about 0.5 mm and about 30 mm, and a resonant frequency between about 10 and about 500 GHz;

Also described is a gas sensing method, which may include applying radiation from a mm wave source to an aperture, and applying the radiation from the source to at least one lithographically fabricated high-Q resonator coupled to the mm wave source, wherein the resonator has a plurality of cavities filled with a sample gas, and wherein the cavities have a characteristic dimension of between about 0.5 mm and about 30 mm, and a resonant frequency between about 10 and about 500 GHz;, and measuring the magnitude of the radiation transmitted through the cavities as a function of the frequency of the radiation, to identify constituents of the sample gas.

These and other features and advantages are described in, or are apparent from, the following detailed description.

BRIEF DESCRIPTION OF THE DRAWINGS

Various exemplary details are described with reference to the accompanying drawings, which however, should not be taken to limit the invention to the specific embodiments shown but are for explanation and understanding only.

FIG. 7A, FIG. 7B, FIG. 7C, FIG. 7D, FIG. 7E, FIG. 7F and FIG. 7G show a process for making the gas sensor using aluminum as the bulk material;.

FIG. 8A, FIG. 8B, FIG. 8C, FIG. 8D, FIG. 8E and FIG. 8F show a process for making the gas sensor using a silicon multi-wafer stack as the material;

It should be understood that the drawing is not necessarily to scale, and that like numbers maybe may refer to like features.

DETAILED DESCRIPTION

Gases are composed of low molecular weight molecules, since only small molecules are gaseous at ambient temperatures. In the gas phase, these small molecules are constantly moving in highly precise quantum rotational states. The energy levels of these quantum states are extensively cataloged and the transition energies between states are known to a very high precision, nine significant figures (one part per billion or ppb). By detecting the microwave or mm wave emission from interstellar dust clouds, radio astronomers can unambiguously identify the molecular species in the dust clouds, even though the clouds are 10's-100's of light years distant. This emission occurs from said molecule when it relaxes from one rotational quantum state to a lower rotational quantum state. The identification is possible because the emission frequency is precisely known to 1 ppb and thus provides a fingerprint for the molecule. These emission frequencies are generally in the microwave or mm wave part of the electromagnetic spectrum, or roughly 10-500 GHz.

The term mm wave, used throughout this document, should be understood to refer to radiation in this frequency range, which corresponds to free space wavelengths of on the order 0.5 to 30 mm. Such radiation will simply be referred to as mm Wave for the remainder of this disclosure.

By "high-Q cavity" should be understood to mean that a photon may be reflected from the walls of the cavity at least about 10 times, or in alternative language, that the width of the passband is about 0.05 wavenumbers at about 15 GHz. Furthermore, orientational references such as "up", "down", "top", "bottom" may be interchangeable, as the device may be operated or fabricated in any orientation. The term "characteristic dimension" should be understood in the context of a resonant frequency, wherein the characteristic dimension is about ½ of the wavelength of the corresponding frequency of interest. For example, if the frequency is about 14.8 GHz. The corresponding wavelength is about 20 mm, and so the characteristic dimension is about 10 mm.

These precise transition frequencies can be used terrestrially to sense and identify gases for applications such as air pollution monitoring, automotive engine performance optimization, industrial chemical synthesis control, automotive passenger compartment $CO_2$ sensing, home carbon monoxide sensing, fermentation process control, and indoor agriculture.

Figure 1:
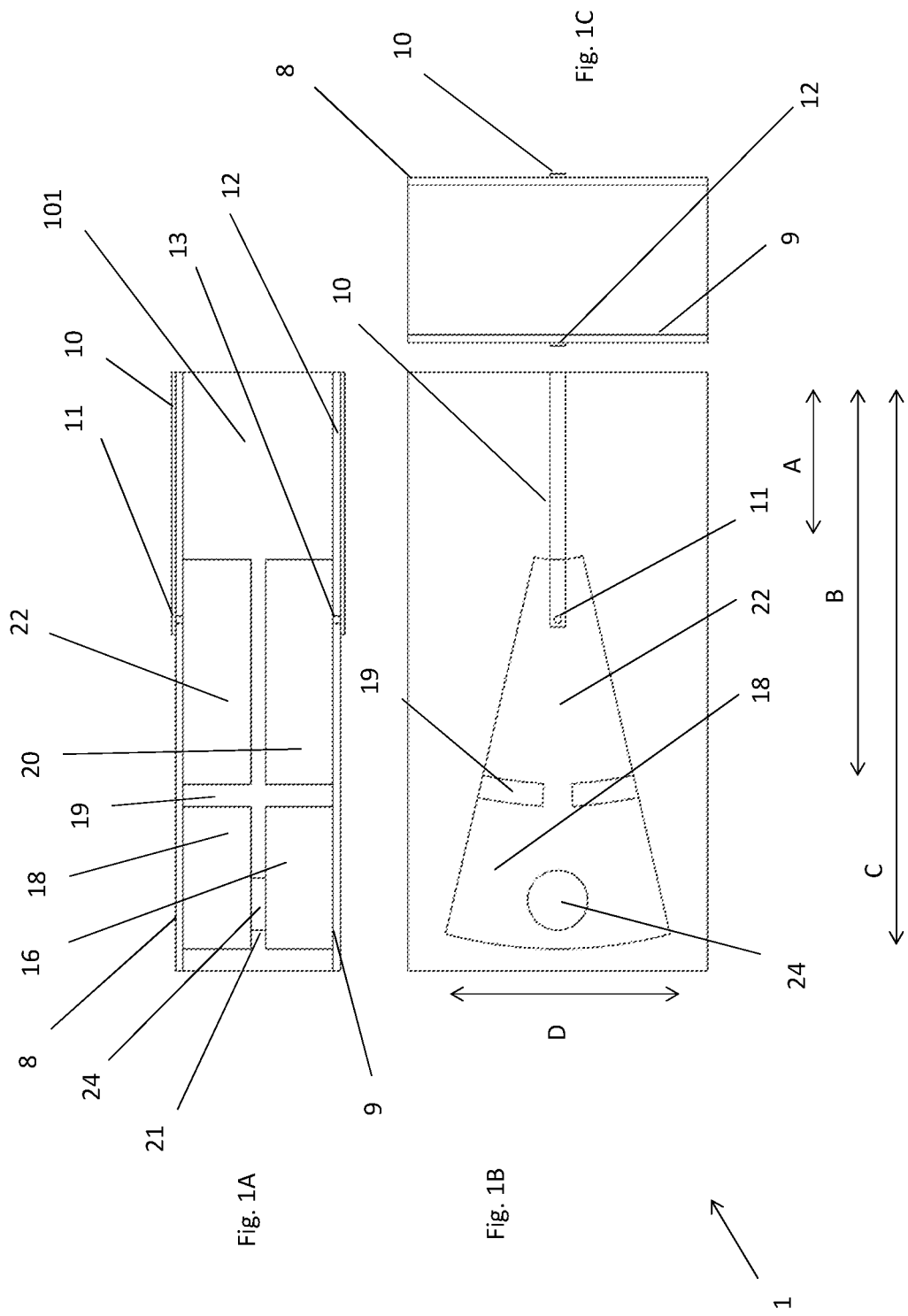
FIG. 1a is an illustrative exemplary cross sectional view of a first embodiment of a mm wave resonator structure.
FIG. 1b is an illustrative exemplary plan view of a first embodiment of a mm wave resonator structure.
FIG. 1c is an illustrative exemplary cross sectional end view of a first embodiment of a mm wave resonator structure.

The following discussion presents a plurality of exemplary embodiments of the novel photolithographically fabricated gas sensing system. The following reference numbers are used in the accompanying figures to refer to the following:

8, 9 top, bottom insulating layers
10, 12 input, output conductor
11, 13 input, output aperture
19, 21 vertical, horizontal dividing walls
22 First cavity
18 Second cavity
16 Third cavity
20 Fourth cavity
24, 24' Cavity aperture
30 PZT
34 detector
36 source
101 First substrate material
150 Malleable starting material
160 Semiconductor substrate
165 Semiconductor stack
200 Stamp FIG. 1 shows a first representative mm wave resonant structure 1, consisting of four cavities or "poles." As is well known from filter theory, the dimensions of each of these poles can be shifted slightly to optimize the width of the passband, the sharpness of the cut off frequencies, that is, the cut off characteristics of the band rejection. It should be understood that this embodiment, as those following, is exemplary only, and that the mm filter structure may use any number of resonant cavities, including just a single resonant cavity. Each gas sensor may include at least one such resonant structure 1.

FIG. 1A is a cross-sectional diagram of the mm wave resonant structure 1. In FIG. 1A, reference number 10 refers to an input conductor, and reference number 12 refers to an output conductor. The input conductor may deliver a mm Wave signal from a mm wave source, which is not shown in FIG. 1, but could be an IMPATT diode or a Gunn diode, for example, as will be discussed further below.

As shown in FIG. 1A, a mm wave resonant structure may be formed with four cavities 16, 18, 20, and 22. The first cavity, 22 may receive the signal from the source through an input aperture 11. The signal is then transmitted from the first cavity 22 to the second cavity 18 through a hole in a vertical wall 19, which may be seen more clearly in the plan view of FIG. 1B. From the second cavity 18, the signal may be transmitted through another aperture 24 though the horizontal wall 21, into the third cavity 16. The signal is then transmitted from the third cavity 16 to the fourth cavity 20 through an similar aperture 19 in the vertical wall. The signal may finally be delivered from the fourth cavity 20 to an output aperture 13, and then to the output conductor 12.

These cavities may be separated by remaining material of the substrate 101. Thus the cavities 22 and 18 may be separated vertically by 19, and horizontally by wall 21. Similarly, cavities 16 and 20 they may be separated vertically by 19, and horizontally by wall 21. These voids or cavities may include metallic side walls, or they may be coated with a metallic, reflective material. The sidewall coating may be, for example, gold. In other embodiments, the metallic sidewall coating may be nickel, copper, aluminum or silver, for example.

The cavities 16, 18, 20, and 22 maybe dimensioned so as to support resonant excitation by the input signal. Accordingly, some frequencies in the input signal maybe well supported by the cavity structure, where as other frequencies will not. Therefore, the structure may act as a band pass filter, passing some frequencies with low loss, while attenuating other frequencies.

FIG. 1B is the plan view of the mm wave resonant structure that was shown in cross section in FIG. 1A. In the plan view only the upper surface is visible. Accordingly, of the four cavities 16, 18, 20, and 22, only two, 18 and 22, are shown in FIG. 1B. Similarly, of the conductors 10 and 12, only 10 is shown in FIG. 1B.

FIG. 1B shows more clearly the placement of the through hole 24 and the through hole 11. As shown in FIG. 1B, the input signal travels along input line 10 through hole 11, and into the first cavity 22. The signal may resonate in cavity 22, if the cavity has been designed to support the mode. Cavity 22 is then coupled into the second cavity 18 through the aperture in wall 19. Because of the resonant behavior of the structure with respect to an excitation signal, the signal may be reflected back and forth between the sidewalls of each cavity many times. Accordingly, the signal may traverse the dimension of the cavity many times, before finally exiting at the exit port 13.

From second cavity 18, the signal is coupled into the lower cavity 16, by through hole 24 as shown in the plan view of FIG. 1B. From the lower cavity 16, the excitation is coupled into the fourth and final cavity 20, and then through the lower whole hole 13, and onto the output conductor 12.

FIG. 1C so shows the end on view of the mm wave resonant structure. In this view, only the input conductor 10 and the output conductor 12 are shown. The other layered features 8 and 9 may be an insulating layer that insulates the input and output conductors from the rest of the metallic substrate.

What follows are some exemplary dimensions for some important features in the structure 1. It should be understood that these dimensions are exemplary only, and that other dimensions can be used, depending on the application. Referring to FIG. 1B, A may be about 10 mm, B may be about 25 mm, C may be about 28 mm, and D may be about 4 mm. The aperture diameter 24 may be about 2.5 mm and the input and output apertures 11, 13 may be less than about 1000 microns mm. The width of walls 19 and 21 may be about 1 mm. The width of input and output conductors may be about 50-100 microns. The angle subtended by the resonant structure may be about 10 to about 30 degrees, although as discussed below the cavities may be rectangular.

Figure 2:
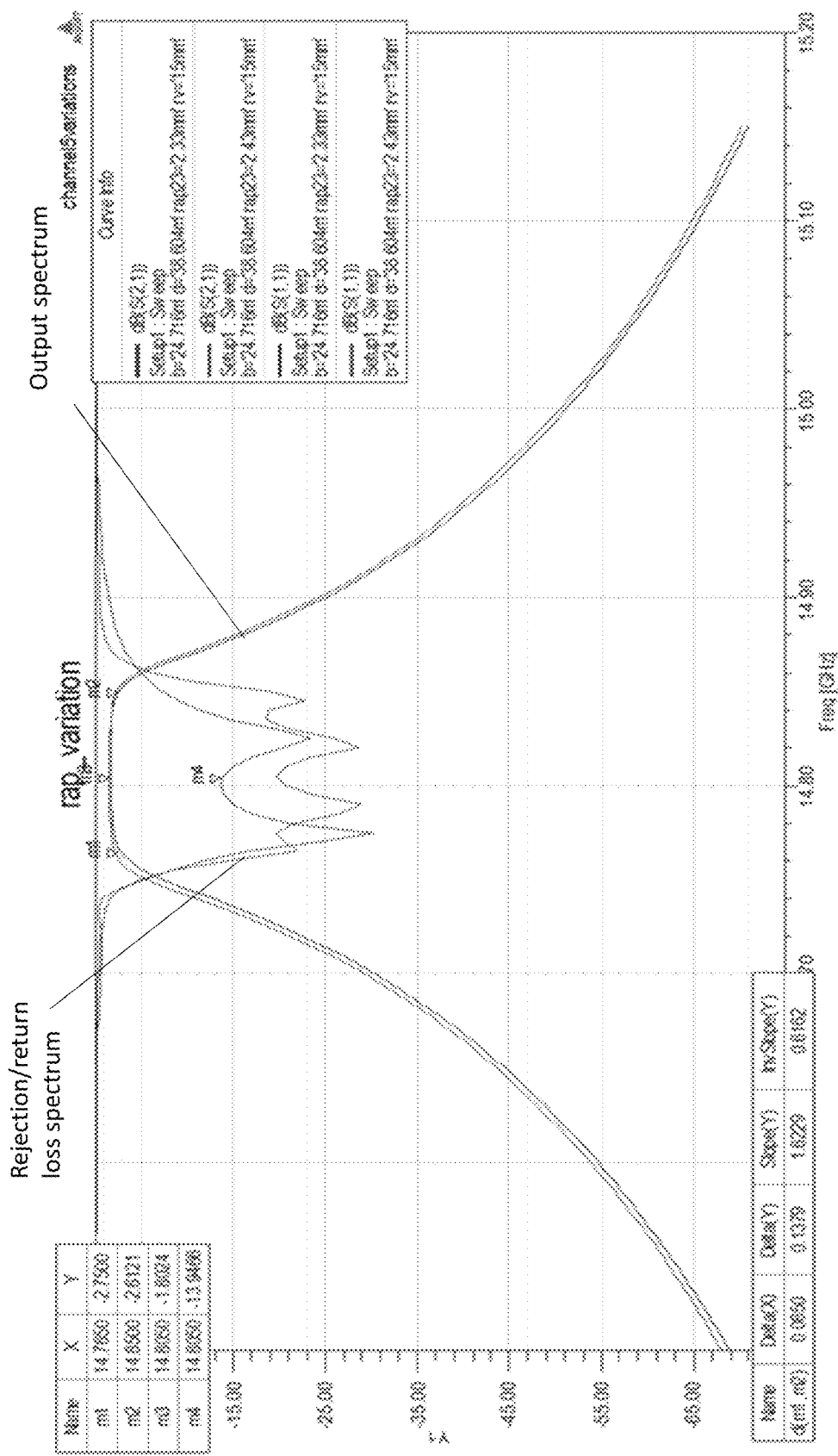
FIG. 2 is a graph showing a typical passband characteristics of a cavity filter or mm wave resonator structure.

FIG. 2 is a chart showing the spectral response of the component of the MEMS gas sensor shown in FIGS. 1A, 1B and 1C. FIG. 2 shows the frequency response to an input signal having components primarily between 14 and 15 GHz. As seen in FIG. 2, the transmitted signal is relatively flat over the passband of this resonant cavity. In contrast, the returned signal has considerable amplitude variation in its spectral content. The notches at around 14.80 and 14.90 GHz result from the response of the cavities with respect to the frequency components of the signal. The passband of the resonant filter is about 0.3 GHz (300 MHz) at about 14.5 GHz, or about 0.166 wavenumbers. As can be seen in FIG. 2, the structure shown in FIGS. 1A, 1B and 1C does indeed act like a bandpass filter with respect to the frequency content of this input signal.

Similar structures can be made with fewer or more poles. However, a typical passband characteristic for the four-cavity resonant structure 1 may be as shown in FIG. 2.

Figure 3:
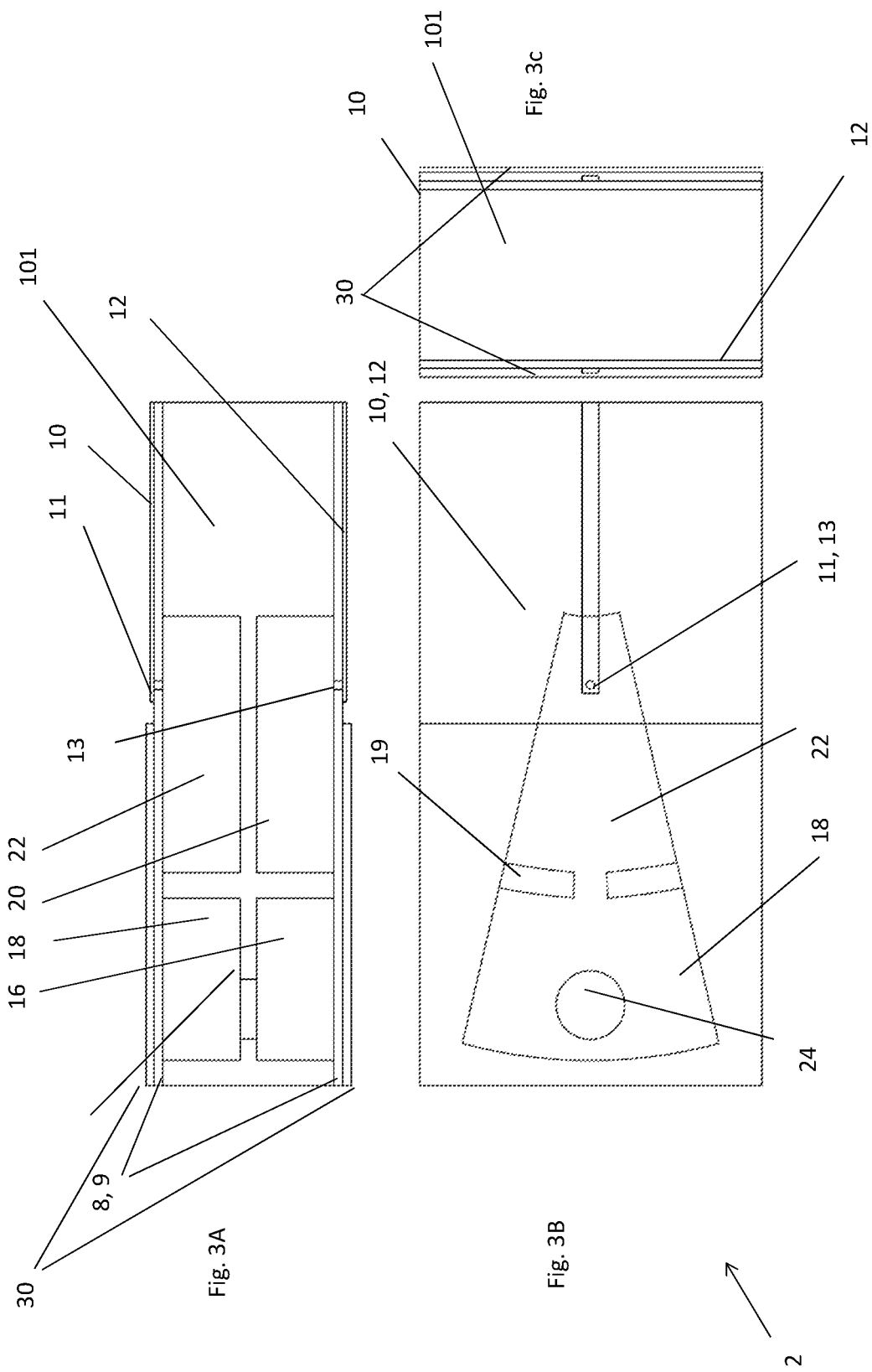
FIG. 3a is an illustrative exemplary cross sectional view of a second embodiment of a mm wave resonator structure.
FIG. 3b is an illustrative exemplary plan view of a second embodiment of a mm wave resonator structure.
FIG. 3c is an illustrative exemplary cross sectional end view of a second embodiment of a mm wave resonator structure.

If the top and bottom plates are made to be deformable, the cavity resonance frequency may be tuned. Deformability of these top and bottom plates can be achieved by forming a bi-morph of Si and PZT, for instance, as shown in FIG. 3. PZT or Lead zirconate titanate is an inorganic compound with the chemical formula $Pb[Zr_xTi_{1-x}]O_3$ ($0 \leq x \leq 1$). PZT is a ceramic perovskite material that shows a marked piezoelectric effect, meaning that the compound changes shape when an electric field is applied. It is used in a number of practical applications such as ultrasonic transducers and piezoelectric resonators. This bi-morph could also be fabricated from Si and AlN, and other materials as well, to form a layered structure. The bi-morph may be used to alter the effective dimension of the cavity, and thus may de-tune, broaden or shift the passband of the cavity with respect to the radiation.

FIG. 3 is a diagram of another embodiment mm wave resonant structure 2. FIG. 3A shows the mm wave resonant structure in cross sectional view, FIG. 3B shows the structure in plan view, and FIG. 3C shows the structure end-on cross section.

FIGS. 3A, 3B and 3C show another representative mm wave structure consisting of four cavities or "poles." As is well known from filter theory, the dimensions of each of these poles can be shifted slightly to optimize the width of the passband, the sharpness of the cut off frequencies, that is, the cut off characteristics of the band rejection.

As described above with respect to FIG. 1, FIG. 3A is a cross-sectional diagram of the mm wave resonant structure 2. In FIG. 3A, reference number 10 refers to an input conductor, and reference number 12 refers to an output conductor. As shown in FIG. 3A, a substrate one may be formed with four cavities 16, 18, 20, and 22.

These cavities may be separated by remaining material of the substrate 101. They may be separated vertically by 19, and they may be separate horizontally by 21 A hole 11 formed in the input conductor 10, can inject the signal carried on conductor 10 into the first void, or cavity, 22. The structure shown in FIG. 3A includes four voids, or cavities. These voids or cavities may include metallic side walls, or they may be coated with a metallic, reflective material. The sidewall coating may be, for example, gold. In other embodiments, the metallic sidewall coating may be nickel, copper, aluminum or silver, for example.

As before, the cavities 16, 18, 20, and 22 maybe dimensioned so as to support resonant excitation by the input signal. Accordingly, some frequencies in the input signal may be well supported by the cavity structure, where as other frequencies will not. Therefore, the structure may act as a band pass filter, passing some frequencies with low loss, while attenuating other frequencies.

The addition of PZT layers 30 in FIG. 3A allow the dimensions of the cavities or voids 16, 18, 20 and 22 to be varied slightly but significantly. As described above, the variation of the exact dimensions of the cavities will alter the passband performance of the structure. These variations may be used to correct manufacturing deviations or errors. Alternatively, the deviation, if sufficient, may be used to tune the structure to an absorption feature of another component of the gas sample. It may also be possible to detune each cavity or void 16, 18, 20 and 22 to a different dimension, to alter, for example to widen or blur, the passband features of the structure. The PZT layers 30 may be disposed over all, or over a portion of the cavities 16, 18, 20 and 22, as shown.

FIG. 3B is the plan view of the component of the mm wave resonant structure 2 that was shown in cross section in FIG. 3A. In the plan view only the upper surface is visible. Accordingly, of the four cavities 16, 18, 20, and 22, only two, 18 and 22, are shown in FIG. 3B. Similarly, of the conductors 10 and 12, only 10 is shown in FIG. 3B.

FIG. 3B shows more clearly the placement of the through hole 24 and the through hole 11. As shown in FIG. 3B, the input signal travels along input line 10 through hole 11, and into the first cavity 22. The signal begins resonant excitation of cavity 22 which is then coupled into the second cavity 18. Because of the resonant behavior of the structure with respect to an excitation signal, the signal may be reflected back and forth between the sidewalls of each cavity many times. Accordingly, the signal may traverse the dimension of the cavity many times, before finally exiting at the exit port 13.

From second cavity 18, the signal is coupled into the lower cavity 16, by through hole 24 as shown in the plan view of FIG. 1B. From the lower cavity 16, the excitation is coupled into the fourth and final cavity 20, through the lower whole hole 13, and onto the output conductor 12.

Because of the plan view of FIG. 3B, the PZT structure cannot be seen in FIG. 3B, however, its' placement is shown in FIG. 3C. FIG. 3C so shows the end on view of the mm wave resonant structure 2. In this view, only the input conductor 10 and the output conductor 12 are shown. The other layered features 8 and 9 may be an insulating layer that insulates the input and output conductors from the rest of the metallic substrate. The PZT layers 30 are shown on the top and the bottom of resonant structure 2.

A Gunn diode, also known as a transferred electron device (TED), is a form of diode, a two-terminal passive semiconductor electronic component, with negative resistance, used in high-frequency electronics. It is based on the "Gunn effect" discovered in 1962 by physicist J. B. Gunn. Its largest use is in electronic oscillators to generate microwaves, in applications such as radar speed guns, microwave relay data link transmitters, and automatic door openers.

Its internal construction is unlike other diodes in that it consists only of N-doped semiconductor material, whereas most diodes consist of both P and N-doped regions. It therefore does not conduct in only one direction and cannot rectify alternating current like other diodes, which is why some sources do not use the term diode but prefer TED. In the Gunn diode, three regions exist: two of those are heavily N-doped on each terminal, with a thin layer of lightly n-doped material between. When a voltage is applied to the device, the electrical gradient will be largest across the thin middle layer. If the voltage is increased, the current through the layer will first increase, but eventually, at higher field values, the conductive properties of the middle layer are altered, increasing its resistivity, and causing the current to fall. This means a Gunn diode has a region of negative differential resistance in its current-voltage characteristic curve, in which an increase of applied voltage, causes a decrease in current. This property allows it to amplify, functioning as a radio frequency amplifier, or to become unstable and oscillate when it is biased with a DC voltage.

An IMPATT diode (IMPact ionization Avalanche Transit-Time diode) is a form of high-power semiconductor diode used in high-frequency microwave electronics devices. They have negative resistance and are used as oscillators to generate microwaves as well as amplifiers. They operate at frequencies between about 3 and 100 GHz or more. A main advantage is their high-power capability. These diodes are used in a variety of applications from low-power radar systems to proximity alarms. A major drawback of using IMPATT diodes is the high level of phase noise they generate. This results from the statistical nature of the avalanche process.

Figure 4:
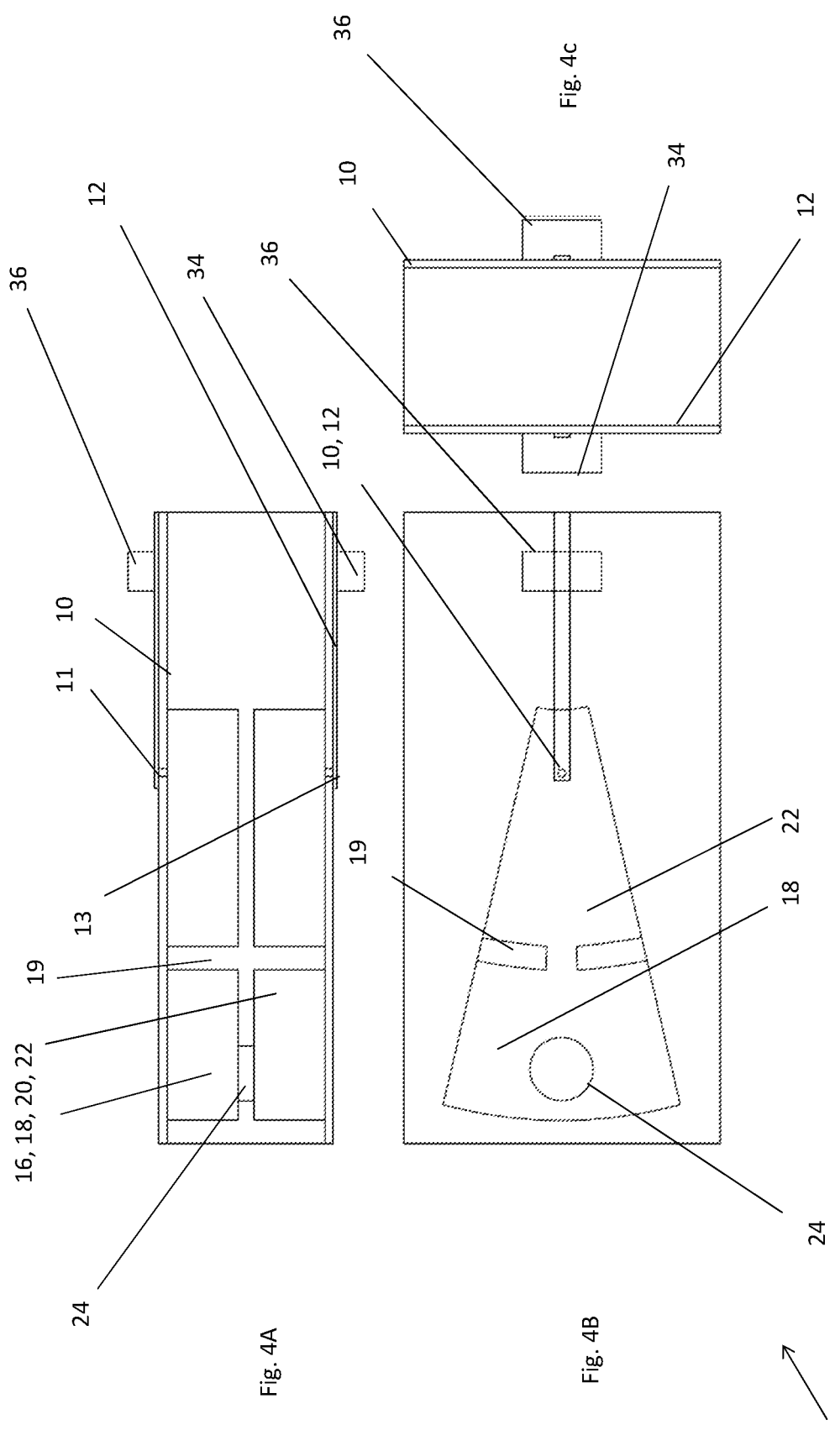
FIG. 4a is an illustrative exemplary cross sectional view of a third embodiment of a mm wave resonator structure.
FIG. 4b is an illustrative exemplary plan view of a third embodiment of a mm wave resonator structure.
FIG. 4c is an illustrative exemplary cross sectional end view of a third embodiment of a mm wave resonator structure.

FIG. 4 is another embodiment of a mm wave resonant structure 3, which is configured as a mm wave spectrometer. A tunable source 36, for example an IMPATT or Gunn diode, is mounted on the top input conductor 10 of the structure. As a detector 34, a zero bias Schottky diode or an avalanche detector, for example, is mounted on the bottom conductor 12.

FIG. 4a shows a cross sectional view of this embodiment of mm wave resonant structure 3; FIG. 4b is an illustrative exemplary plan view of this embodiment of mm wave resonant structure 3; FIG. 4c is an illustrative exemplary cross sectional end view of this mm wave resonant structure 3.

As described above with respect to FIG. 1, in FIG. 4A, reference number 10 refers to an input conductor, and reference number 12 refers to an output conductor. As shown in FIG. 3A, a substrate one may be formed with four cavities 16, 18, 20, and 22.

As before, these cavities may be separated by remaining material of the substrate one. They may be separated vertically by 19, and they may be separate horizontally by 21 A hole 11 formed in the input conductor 10, can inject the signal carried on conductor 10 into the first void, or cavity, 22. The structure shown in FIG. 4A includes four voids, or cavities. These voids or cavities may include metallic side walls, or they may be coated with a metallic, reflective material.

The cavities 16, 18, 20, and 22 maybe dimensioned so as to support resonant excitation by the input signal. Accordingly, some frequencies in the input signal may be well supported by the cavity structure, where as other frequencies will not. Therefore, the structure may act as a band pass filter, passing some frequencies with low loss, while attenuating other frequencies.

As shown in FIG. 4A, the source 36 may be disposed on top of the input conductor 10 and in electrical communication with input conductor 10. Radiation from source 36 may travel down conductor 10 and into the first cavity through aperture 11. Alternatively, source 36 may be disposed directly over the aperture 11 to transmit signal directly into first cavity 22. In any case, the signal from source 36 may be filtered by resonant structure 3.

FIG. 4B is the plan view of the component of the MEMS gas sensor that was shown in cross section in FIG. 4A. In the plan view only the upper surface is visible. Accordingly, of the four cavities 16, 18, 20, and 22, only two, 18 and 22, are shown in FIG. 3B. Similarly, of the conductors 10 and 12, only 10 is shown in FIG. 4B.

FIG. 4B shows more clearly the placement of the through hole 24 and the through hole 11 the placement of source 36 and detector 34. As shown in FIG. 4B, the input signal travels along input line 10 through hole 11, and into the first cavity 22. The signal begins resonant excitation of cavity 22 which is then coupled into the second cavity 18. Because of the resonant behavior of the structure with respect to an excitation signal, the signal may be reflected back and forth between the sidewalls of each cavity many times. Accordingly, the signal may traverse the dimension of the cavity many times, before finally exiting at the exit port 13.

From second cavity 18, the signal is coupled into the lower cavity 16, by through hole 24 as shown in the plan view of FIG. 1B. From the lower cavity 16, the excitation is coupled into the fourth and final chamber 20, through the lower whole hole 13, and onto the output conductor 12 and onto detector 34.

FIG. 4C so shows the end on view of the component of the MEMS gas sensor. In this view, only the input conductor 10 and the output conductor 12 are shown. The other layered features 8 and 9 may be an insulating layer that insulates the input and output conductors from the rest of the metallic substrate.

FIG. 4C shows a suggested placement of source 36 and detector 34. The IMPATT diode 36 is shown mounted atop the conductive layer 10. This source 36 may be swept or tuned through a range of frequencies by sweeping the voltage delivered to the diode through a range of voltages. The sweep may be repeated many times, by varying the voltage sinusoidally, or as a ramp function, for example. The detector Shottky diode 34 may be coupled to a lock in amplifier to detect the signal as a function of the swept input voltage/frequency. When the output frequency of the source 36 is tuned to an absorption band of the gas species, the radiation is absorbed by the gas along the entire path length of the radiation through the resonant cavities. Because of the high-Q nature of the cavities, the effective path length may be quite long, resulting in good signal-to-noise measurement.

Using this swept frequency approach, the device 3 may function as a spectrometer, such that the absorption spectrum of the gas disposed with the resonant cavities 18, 20, 16 and 22 measured, and thus the components are identified.

Figure 5:
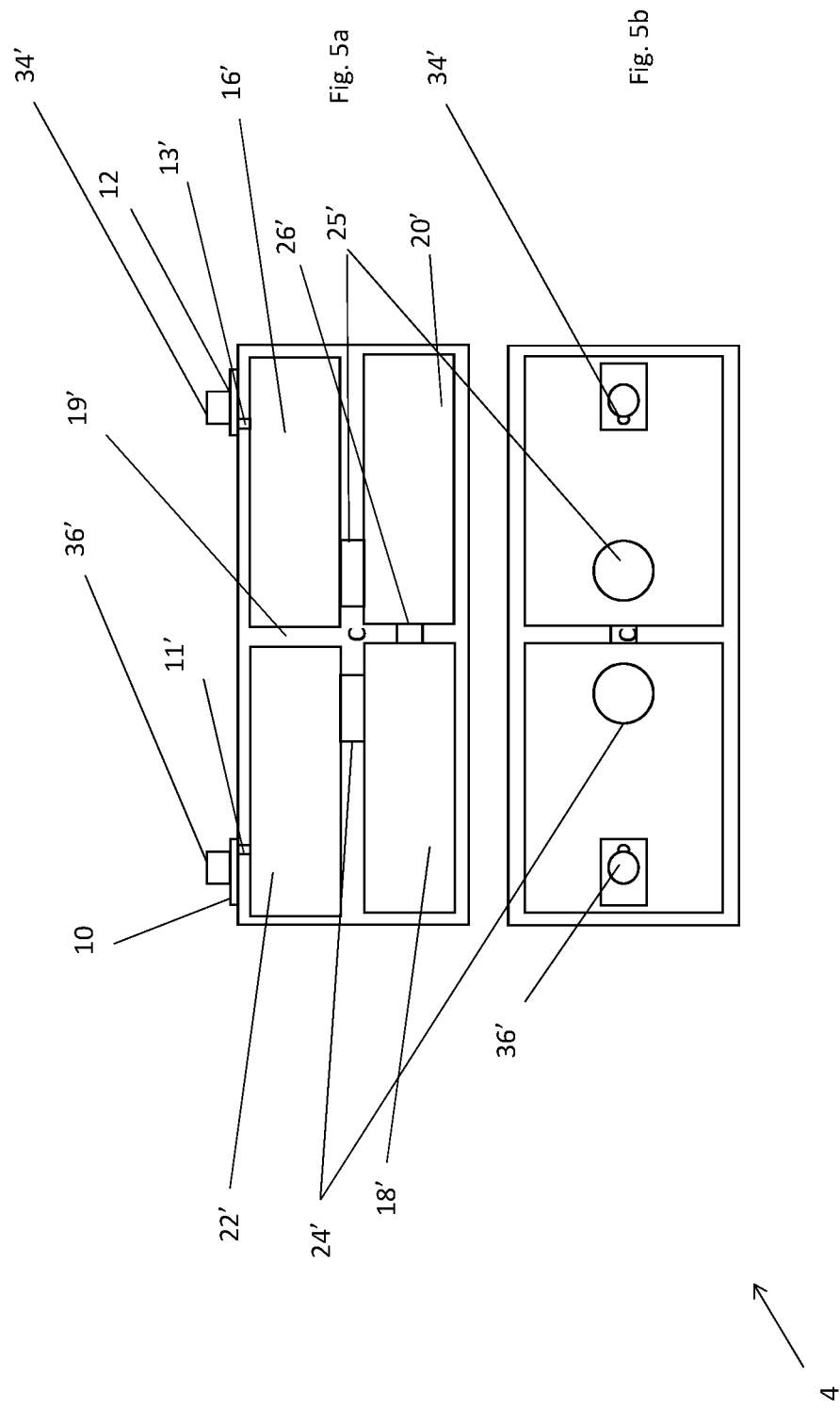
FIG. 5a is an illustrative exemplary cross sectional view of a fourth embodiment of a mm wave resonator structure.
FIG. 5b is an illustrative exemplary plan view of a fourth embodiment of a mm wave resonator structure.

FIG. 5 is another embodiment of a mm wave resonant structure 4. FIG. 5A shows a cross sectional view of this embodiment of mm wave resonant structure 4; FIG. B is an illustrative exemplary plan view of this embodiment of mm wave resonant structure 4, showing placement of the source and detector. Otherwise, the structure is similar to that shown in FIG. 1.

In particular, FIG. 5A is a cross-sectional diagram of another embodiment of the mm wave resonant structure 4. In FIG. 5A, reference number 10 refers to an input conductor, and reference number 12 refers to an output conductor. The input conductor may deliver a mm wave signal from a mm wave source, which is not shown in FIG. 5, but could be an IMPATT diode or a Gunn diode, for example, as will be discussed further below.

As shown in FIG. 5A, a mm wave resonant structure 4 may be formed with four cavities 16', 18', 20', and 22'. The first cavity, 22 may receive the signal from the source through an input aperture 11. The signal is then transmitted from the first cavity 22 to the second cavity 18' through a hole 24' in a vertical wall, which may be seen more clearly in the plan view of FIG. 5B. From the second cavity 18', the signal may be transmitted through another aperture 26' though the horizontal wall, into the third cavity 20'. The signal is then transmitted from the third cavity 20' to the fourth cavity 16' through an similar aperture 19 in the vertical wall. The signal may finally be delivered from the fourth cavity 20 to an output aperture 13, and then to the output conductor 12.

As shown in FIG. 5B, both the source 36 and the detector 34 may be disposed on the same surface of the resonant structure 4. This may require changes to the placement of apertures 24' and 25', such that aperture 24' transmits signal from first cavity 22' to second cavity 18'. Aperture 25' may transmit the signal from cavity 20' to cavity 16'. From cavity 16' the signal is directed to the detector 34'.

As before, the cavities 16', 18', 20', and 22' maybe dimensioned so as to support resonant excitation by the input signal. Accordingly, some frequencies in the input signal maybe well supported by the cavity structure, where as other frequencies will not. Therefore, the structure may act as a band pass filter, passing some frequencies with low loss, while attenuating other frequencies.

FIG. 5B is the plan view of the component of the mm wave resonant structure that was shown in cross section in FIG. 5A. In the plan view only the upper surface is visible. Accordingly, of the four chambers 16', 18', 20', and 22', only two, 16' and 22', are shown in FIG. 5B. Similarly, of the conductors 10' and 12', only 10' is shown in FIG. 5B.

FIG. 5B shows more clearly the placement of the through hole 24' and the through hole 11'. As shown in FIG. 5B, the input signal travels along input line 10' through hole 11', and into the first chamber 22'. The signal is reflected back and forth between the wall of cavity 22', and is then coupled into the second chamber 18'. Because of the resonant behavior of the structure with respect to an excitation signal, the signal may be reflected back and forth between the sidewalls of each cavity many times. Accordingly, the signal may traverse the dimension of the cavity many times, before finally exiting at the exit port 13'. From the exit port 13' in the last chamber 16', the excitation directed onto the detector 34, disposed on the same side as the source 36'.

Figure 6:
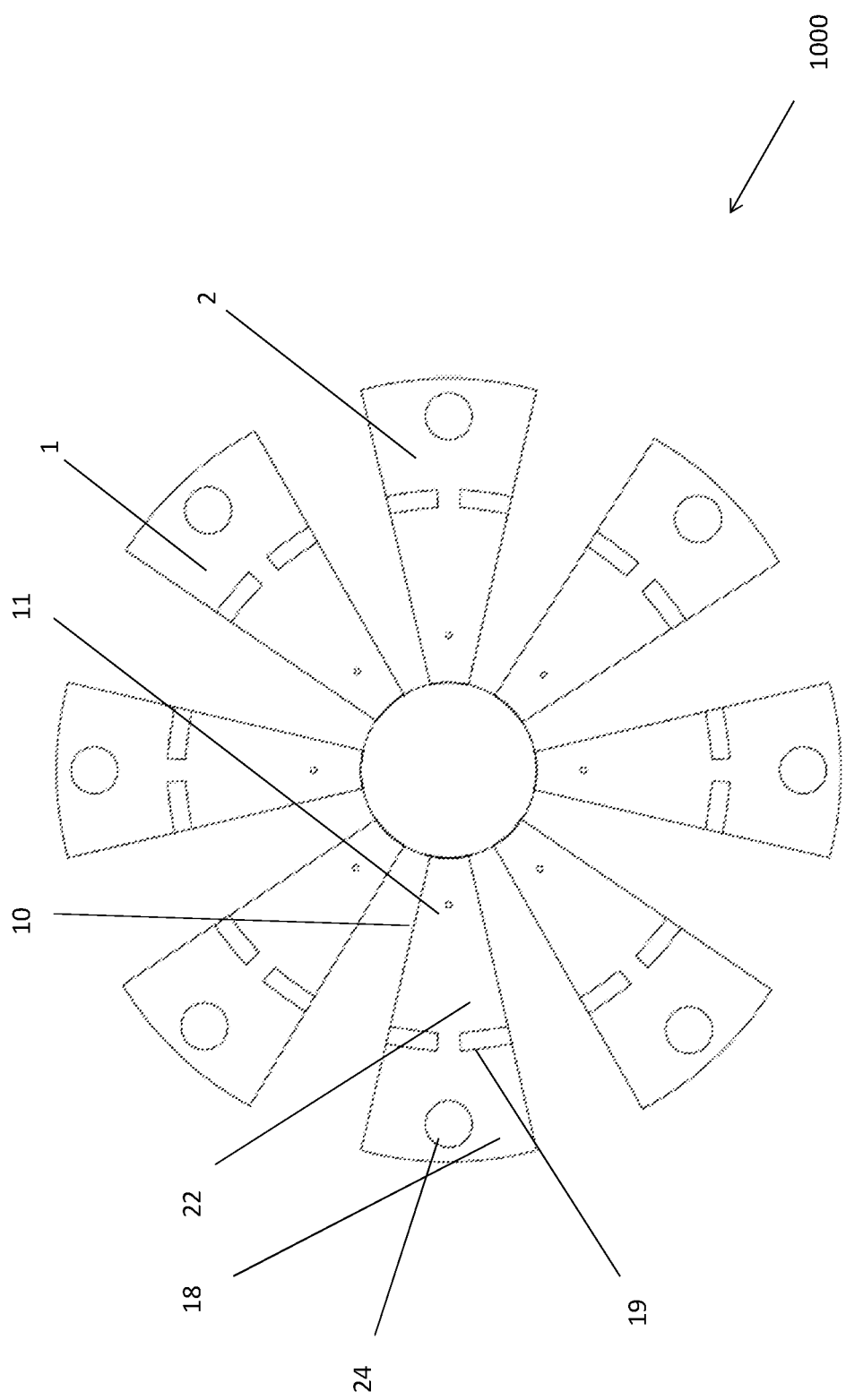
FIG. 6 is a composite 8-component, symmetrical gas sensor using the mm wave resonator structures illustrated previously.

FIG. 6 shows a fully configured eight-component resonant gas sensor 1000. This embodiment maybe circular, and symmetric, and include eight of the components previously illustrated in FIGS. 1, 3, 4 and 5. The structure shown in FIG. 6 is exemplary only, and other embodiments having other numbers of resonant cavities, laid out either rectilinearly or circularly, or in any other orientation with respect to one another, are also envisioned. The gas sensor 1000 is shown with 8 resonant structures, of which only two are numbered 1, 2. It should be understood that the remaining unnumbered structures may be identical, or different to structures 1, 2. Any of the structures described above, for example resonant structure 1, 2, 3 or 4 may be used, for example, in the gas sensor device illustrated in FIG. 6.

As with the structure 3 illustrated in FIG. 4, the gas sensor 1000 may use an IMPATT diode or Gunn diode as a source. Although not shown in FIG. 6, the IMPATT diode 36 may be mounted atop the conductive layer 10. This source 36 may be swept or tuned through a range of frequencies by sweeping the voltage delivered to the diode through a range of voltages. The sweep may be repeated many times, by varying the voltage sinusoidally, or as a ramp function, for example. The detector Shottky diode 34 may be coupled to a lock in amplifier to detect the signal as a function of the swept input voltage/frequency. When the output frequency of the source 36 is tuned to an absorption band of the gas species, the radiation is absorbed by the gas along the entire path length of the radiation through the resonant cavities. Because of the high-Q nature of the cavities, the effective path length may be quite long, resulting in good signal-to-noise measurement.

Using this swept frequency approach, the device 1000 may function as a spectrometer, such that the absorption spectrum of the gas disposed within the resonant cavities 18, 20, 16 and 22 is measured, and thus the components are identified.

It should be understood that if a plurality of structures is used in such a device, each cavity may have the same or different resonant properties. For example, one structure may be designed to resonate a 14.8 GHz signal, and another designed to resonate a 18 GHz signal, depending on the application and the target gas species. Each resonant structure may be designed, for example, with the goal of measuring signal at a different of absorption features of the same target gas, thus enhancing confidence in the outcome of the measurement. Or each structure may be tuned to an absorption feature of one of a plurality of gaseous species expected to be present. For example, each component 1, 2 may be tuned to detect a different species of environmental gases, such as $NO_2$, $N_2O$, $CO$, $CO_2$, $NO$, and $O_2$, for example.

Once again, each structure 1, 2 may comprise an input conductor 10 along with a feed through or aperture 11, and four cavities or voids, 16, 18, 20, and 22. Because of the plan view, only cavities 18 and 22 are visible in this illustration. The signal may enter along input line 10, and may be coupled into cavities 20 through the via feed through 11. The signal then resonates because the frequency of the signal matches the resonant structure of the cavity, and the high-Q nature of the structure. This excitation is transmitted through barrier 19 into the second cavity 18. The signal may also resonate in the second cavity 18. This excitation is then coupled through hole 24 into the lower cavity 16 (not seen). The signal is then coupled into the final cavity 20, through the hole 19, and into the final cavity 20. A similar path may be used in each resonant component, of which two are labelled 1 and 2 in FIG. 6.

Each resonant component may have a signal of a different frequency coupled thereto. Accordingly, each resonant component 1, 2 may be optimized to detect a different frequency. In the structure shown in FIG. 6, 8 separate channels are illustrated, although it should be understood that there may be fewer than 8 or more than 8, depending on the implementation. Each resonant component may have its own signal line and source diode to bring the signal to and from the structure, or some resonant components may share the same signal line and source diode, thus using the same frequency.

From this final cavity, feedthrough hole 13 delivers the filtered signal to the output line 12. Output line 12 and aperture 13 are not seen in this figure because it lies directly beneath the input line 10 and aperture 11.

As with the individual components shown in FIGS. 1, 3 and 4, the transmission properties of the structure shown are frequency dependent, and depend critically on the dimensions of the individual cavities 16, 18, 20, and 22. Furthermore each of these cavities on the eight different arms of this device may have somewhat different dimensions. Accordingly the frequency response of the entire structure may depend on the details of each of its components.

Accordingly passband filters may be made with quite complicated frequency responses.

This entire structure shown in FIGS. 1, 3-6 may be made using forming techniques on a malleable material, or photolithographically on a semiconductor substrate, for example. Two exemplary process flows are shown in remaining FIGS. 7 and 8, and described below. The first process using a malleable material may be more suitable for larger structural dimensions, suitable to longer wavelengths (lower frequencies). The photolithographic method may be capable of making smaller features, and thus higher frequencies.

The first process, shown in FIG. 7A-G, includes FIGS. 7A, 7B, 7C, 7D, 7E, 7F and 7G, and illustrates a process flow which can be used to make the gas sensor using a malleable material, such as aluminum for example, as a starting substrate. Other suitable substrate materials may include gold, zinc, nickel and copper, for example.

FIG. 7A shows the starting substrate 150, which in this case may be an aluminum slab 150. In FIG. 7B, a stamp or mandrill 200 may be brought into contact with the aluminum slab 150. The metal plate (FIG. 7A) of Al may embossed by a hard mandrill 200 to form the cavities on the top side and the bottom side of the metal slab 150. The stamp 200 may be applied to both sides of aluminum slab 150, resulting in the shape shown in FIG. 7C. Upon applying pressure to the stamp 200, the indentations may be made which will create cavities 16, 18, 20 and 22 in the aluminum slab 150. These cavities formed may have a depth on the order of 100-500 um. FIG. 7C shows the resulting topology of the aluminum plate 150, upon stamping with cavities or voids 16, 18, 20, and 22. A hole may be formed to create the aperture 24 between the upper cavity 18 and the lower cavity 16. This hole may be etched or drilled. The situation is as shown in FIG. 7C. If the substrate material 150 is not sufficiently conducting, another metal material may be sputter deposited conformally onto substrate 150.

Following the hole formation, a swage bond of a top and bottom metal plate (FIG. 7D) may be applied to the structure. These metal plates may form conductive layers, 10 and 12, which may then be formed on the outside surface of the aluminum substrate 150. The conductive layer may be for example, gold, or copper, as shown in FIG. 7D. The through holes 11 (input port) and 13 (output port) are shown formed FIG. 7E, for example by etching or drilling. The resonant cavities themselves may also be formed by drilling to machining.

The source 36 and detector 34 may then be bonded over the input and output ports (FIG. 7F). In FIG. 7F, Gunn diodes 36 is shown disposed on the top of the structure 150, and adjacent to the through hole 11. A detector 34 may also be disposed on the obverse side, and adjacent to the through hole 13. The Gunn diode 36 may generate the signal that will be launched into input conductor 10, into cavity 22, out to second cavity 18, then into cavity 16, and then into cavity 20, and our through aperture 13 to output conductor 12. The completed aluminum structure is shown in FIG. 7G.

If tunability is required, piezo-electric crystals or films 32 can be bonded over one or more cavities (FIG. 7G).

A second method of manufacturing the cavities is shown in FIG. 8A-F, includes FIGS. 8A, 8B, 8C, 8D, 8E, and 8F, that employs lithographic, etching, and deposition methods typical of semiconductor manufacturing facilities. The process starts on a Si wafer (FIG. 8A) that has a through hole providing communication from the top to bottom cavities.

A first silicon substrate 160 may be formed with a through hole 24 form therein. Subsequent silicon substrates 165 may be formed with through holes that will define cavities 18, and 22 on the topside, and 16 and 20 on the bottom side. The subsequent substrates 165 maybe coupled above and below the first silicon substrate 160 to form a multi layer stack 165 as shown in FIG. 8B. Then a plurality of Si wafers may all be etched with identical through holes to define the cavities (FIG. 8B).

These wafers may be stacked to form the desired cavity depth, which is in the range of 100-500 um (2 to 10 wafers per side). These etches can be carried out using DRIE etch methods, which are well known and are not described here. Anisotropic wet etching of Si using KOH on <110> Si is also a viable process and is also well known. The stacked wafers are bonded to one another and to the each side of the starting wafer (FIG. 8C). A highly conductive metal is then deposited into the cavities. This metal must cover the bottom and the sidewalls of the cavities (FIG. 8D). Final wafers are then bonded to each side of the stack to enclose the cavities (FIG. 8E). Launch and receive holes are etched into these final wafers (FIG. 8F). Although not shown in FIG. 6, the stack is then diced and source and detector are bonded to the final chips. If tunability is needed, piezo-electric devices can be bonded over one or more of the cavities. Either of these cavity fabrication methods can be used to easily replicate a plurality of voids or apertures on a single substrate, as shown in FIG. 8. Note that each of the voids or apertures can have unique dimensions and thus provide a means to sense multiple gases on a single device. Alternately multiple voids or apertures can provide a means to enhance specificity for a single gas, as described above with respect to FIG. 6.

The plurality of substrates may then be bonded using, for example, a thermocomporession bond as shown in FIG. 8C. The multilayer stack may then be conformally coated with a layer of conductive material as shown in FIG. 8D The multilayer stack may then have another intact silicon substrate bonded over the top and bottom of the stack, thereby enclosing the cavities or voids 16, 18, 20 and 22. The input (11) and output (13) apertures may then be etched into these intact silicon substrates as shown in FIG. 8F. These apertures may allow the input signal to be coupled into the first cavity or void, and the output signal to be coupled out of the last cavity or void.

The component is now essentially complete and can be used as set forth above or in the full sensor such as illustrated if FIG. 6. It should be obvious to those skilled in the art that multiple components may be formed on a single substrate as shown in FIGS. 7 and 8. That is, although a single device is shown being fabricated, multiple, photolithographically fabricated devices may be formed at one time.

Accordingly, a gas sensing device is described. The sensing device may include at least one of a Gunn diode and an IMPATT diode mm wave source, and a lithographically fabricated high-Q resonator coupled to the mm wave source, wherein the resonator has a plurality of cavities with a characteristic dimension of about 1 mm.

The at least one lithographically fabricated high-Q resonator may have at least one cavity formed in a semiconductor substrate, wherein the resonator has at least one cavity formed in a semiconductor substrate, wherein the at least one cavity has a characteristic dimension of about one half of a wavelength in the frequency spectrum of the mm-wave emission source, wherein the at least one cavity is dimensioned to define a resonant structure for at least some frequencies in the frequency spectrum of the mm wave source. That is, if the frequency spectrum includes the frequency of 14.8 GHz, this corresponds (in air) to a wavelength of about 22 mm. Accordingly, the cavity would have a characteristic dimension of about 10 mm.

The gas sensing device may also include a gas sample contained within the resonator cavities and a mm wave detector. The plurality of resonators may comprise four resonators configured to have a passband matching an output wavelength of the mm wave source, and to reject other wavelengths with a rejection ratio of about 70 dB.

The gas sensing device may include a top and bottom plate which are deformable, such that the resonant characteristics of the cavity can be tuned. The deformable plates may comprise a bi-morph of Si and PZT. The mm wave source may be at least one of an IMPATT and Gunn diode source mounted on a top of the resonator the detector is a zero bias Schottky diode mounted on the bottom of the resonator. The characteristic dimension may determine at least one of a width of the passband, the sharpness of the cut off, the out of band rejection.

In the gas sensing device, a spectrum of the mm wave source may overlap an absorption feature of the gas sample. The plurality of cavities may comprise four cavities.

A method for sensing gases is also described. The method may include applying radiation from at least one of a Gunn diode and an IMPATT diode mm wave source, and applying the radiation to lithographically fabricated high-Q resonator coupled to the mm wave source, wherein the resonator has a plurality of cavities filled with a sample gas, wherein the cavities have a characteristic dimension of between about 0.5 mm and about 30 mms, and a resonant frequency between about 10 and about 500 GHz, and measuring the magnitude of the radiation emitted from the cavities.

The plurality of resonators may comprise four resonators configured to have a passband matching an output wavelength of the mm wave source, and to reject other wavelengths with a rejection ratio of about 70 dB. Within the method, a top and bottom plate of at least one cavity are deformable, such that the resonant characteristics of the cavity can be tuned. The deformable plates may comprise a bi-morph of Si and PZT. The mm wave source may be at least one of an IMPATT and Gunn diode source mounted on a top of the resonator the detector is a zero bias Schottky diode mounted on the bottom of the resonator. The characteristic dimension determines at least one of a width of the passband, the sharpness of the cut off, the out of band rejection. A spectrum of the mm wave source overlaps an absorption feature of the gas sample. The plurality of cavities may comprise four cavities.

A method for manufacturing a gas sensor is also described. The method may include applying radiation from a mm wave source to an aperture, and applying the radiation from the aperture to at least one lithographically fabricated high-Q resonator coupled to the mm wave source, wherein the resonator has a plurality of cavities filled with a sample gas, wherein the cavities have a characteristic dimension of about 100 microns, and measuring the magnitude of the radiation transmitted through the cavities as a function of the frequency of the radiation, to identify constituents of the sample gas.

The method may include providing at least one of a Gunn diode and an IMPATT diode mm wave source, lithographically fabricating high-Q resonator coupled to the mm wave source, wherein the resonator has a plurality of cavities with a characteristic dimension of about 100 microns, and coupling the mm wave source to the resonator. The plurality of cavities may comprise four cavities. cavities. Other configurations with a greater or lesser number of cavities are also possible.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes a number of fabrication steps and exemplary dimensions for cavity resonator, it should be understood that these details are exemplary only, and that the systems and methods disclosed here may be applied to any number of alternative MEMS or non-MEMS devices Accordingly, the exemplary implementations set forth above, are intended to be illustrative, not limiting.

What is claimed is:
1. A gas sensing device, comprising:
a mm wave source, emitting radiation having a frequency spectrum in the mm range;
at least one lithographically fabricated high-Q resonator, and coupled to the mm wave source, wherein the resonator has at least one cavity formed in a semiconductor substrate, wherein the at least one cavity has a characteristic dimension of one half of a wavelength in the frequency spectrum of the mm-wave emission source, wherein the at least one cavity is dimensioned to define a resonant structure for at least some frequencies in the frequency spectrum of the mm wave source, wherein the at least one resonator comprises a plurality of resonators, wherein the plurality of resonators are collocated on the semiconductor substrate; and a mm wave detector which detects the radiation transmitted from the mm wave source through the at least one resonator.

2. The gas sensing device of claim 1, where in the frequency spectrum is between 10 to about 500 GHz, corresponding to a characteristic dimension of 0.5 mm and 30 mm.

3. The gas sensing device of claim 1, further comprising: a gas sample contained within the resonator cavities.

4. The gas sensing device of claim 2, further comprising: a mm wave detector.

5. The gas sensing device of claim 2, wherein the at least one cavity comprises four cavities configured to have a passband covering an absorption feature of the gas sample, and to reject other wavelengths with a rejection ratio of about 70 dB, and wherein the mm wave emitter is at least one of a Gunn diode and an IMPATT diode source.

6. The gas sensing device of claim 5, wherein the characteristic dimension determines at least one of a width of the passband, the sharpness of the cut off, the out of band rejection.

7. The gas sensing device of claim 4, wherein the mm wave source is mounted on a top of the resonator and the detector is a zero bias Schottky diode mounted on a bottom of the resonator, and wherein the resonator has plurality of lithographically defined apertures that couple radiation resonating in one cavity into an adjacent cavity, wherein the apertures have a diameter on the order of 50 microns to 500 microns.

8. The gas sensing device of claim 3, wherein the spectrum of the mm wave source overlaps at least one absorption feature of the gas sample.

9. The gas sensing device of claim 1, further comprising a top and bottom plate covering the at least one cavity, wherein at least one of the top and bottom plates are deformable, such that the resonant characteristics of the at least one cavity can be tuned.

10. The gas sensing device of claim 9, wherein the deformable plates comprise a bi-morph of Si and PZT.

11. The gas sensing device of claim 1, wherein the at least one cavity comprises four cavities, and the plurality of resonators comprises eight resonators, each resonator comprising the four cavities.

12. A method for sensing gases, comprising:
applying radiation from a mm wave source to an aperture;
applying the radiation from the aperture to at least one lithographically fabricated high-Q resonator coupled to the mm wave source, gas, wherein the at least one resonator comprises a plurality of resonators, wherein the plurality of resonators are collocated on the semiconductor substrate wherein the resonator each has a plurality of cavities filled with a sample gas, wherein the cavities have a characteristic dimension of between 0.5 mm and 15 mms, and a resonant frequency between 100 and 500 GHz; and
measuring the magnitude of the radiation transmitted through the cavities as a function of the frequency of the radiation, to identify constituents of the sample.

13. The method of claim 12, wherein the plurality of cavities comprises four cavities configured to have a passband matching an output wavelength of the mm wave source, and to reject other wavelengths with a rejection ratio of about 70 dB.

14. The method of claim 12, wherein a top and bottom plate of at least one cavity are deformable, such that resonant characteristics of the cavity can be tuned, and at least one of the top and the bottom plates comprise a bi-morph of Si and PZT.

15. The method of claim 12, wherein the mm wave source is at least one of an IMPATT and Gunn diode source mounted on a top of the resonator the detector is a zero bias Schottky diode mounted on the bottom of the resonator.

16. The method of claim 12, wherein the characteristic dimension determines at least one of a width of the passband, the sharpness of the cut off, the out of band rejection.

17. The method of claim 12, wherein a tunable range of the mm wave source overlaps an absorption feature of the gas sample, and wherein the width of an emission spectrum is narrower than or similar to the absorption feature.

18. The method of claim 12, wherein the plurality of cavities comprises four cavities, and at least one lithographically fabricated high-Q resonator comprises eight resonators formed on the single semiconductor substrate.

19. A method for manufacturing a gas sensor, comprising:
providing at least one of a Gunn diode and an IMPATT diode mm wave source;
coupling the mm wave source to an input conductor;
lithographically fabricating at least one high-Q resonator and coupling the resonator to the mm wave conductor, wherein the resonator has a plurality of cavities with a characteristic dimension of 100 microns and
coupling the mm wave source to the resonator and to a mm wave detector which detects the radiation transmitted from the mm wave source through the at least one resonator.

* * * * *